United States Patent [19]

de Montgolfier et al.

[11] Patent Number: 5,027,059

[45] Date of Patent: Jun. 25, 1991

[54] DIFFERENTIAL CURRENT SHUNT

[75] Inventors: Arnaud de Montgolfier, Neuilly-sur-Seine, France; R. W. Goodwin, Dunwoody, Ga.

[73] Assignee: Schlumberger Industries, Inc., Norcross, Ga.

[21] Appl. No.: 397,941

[22] Filed: Aug. 24, 1989

[51] Int. Cl.$^5$ .................. G01R 1/22; G01R 15/00
[52] U.S. Cl. .................. 324/127; 324/126; 336/175; 338/49
[58] Field of Search .......... 324/127, 126; 338/49; 336/175, 176

[56] References Cited

U.S. PATENT DOCUMENTS 4,492,919 1/1985 Milkovic .................. 324/127
4,580,095 4/1986 De Vries .................. 324/127

*Primary Examiner*—Ernest F. Karlsen
*Attorney, Agent, or Firm*—Sanford J. Asman

[57] ABSTRACT

A differential electrical current shunt which is particularly adapted for the measurement of large currents with high accuracy and substantially free of errors due to ageing, connection resistance and differentials therein and thermally induced resistance changes. The shunt, according to the invention divides the large current into two substantially equal portions by forming a preferably elongated aperture in a conductor carrying the large current; the two portions of the conductor formed by the aperture having substantially equal but slightly differing resistances. The two conductor portions are formed with respect to a core such that the conductor portions each form a single turn coil on the core with the induced flux from each conductor portion opposing that included in the coil by the other of the two conductor portions. Since the conductor portions are in close proximity and formed of a unitary conductor and good thermal and electrical conductivity is assured at both ends of the unitary conductor, proportionality of resistance of the conductor portions is accurately maintained throughout a wide range of currents, resistive heating and other environmental conditions.

15 Claims, 2 Drawing Sheets

DIFFERENTIAL CURRENT SHUNT

TECHNICAL FIELD

This invention relates to electrical current shunts. More particularly, this invention relates to electrical current shunts capable of handling high electrical currents for the purpose of measuring such currents.

BACKGROUND ART

In electrical circuits and measurement circuits in particular, it is often necessary or desireable to develop a voltage proportional to an electrical current or alternating current voltage. Transformers are widely known and used for such a purpose. Transformers are well-known to achieve this function by using a current to induce a magnetic flux in a core of iron or other low reluctance material and to use that flux to induce a voltage in another conductor. The principles of such a transformer have long been well understood. For measurement or other applications requiring extreme accuracy or efficiency in such a conversion, saturation of the core, eddy current losses, frequency effects and the like must be closely controlled. Where high accuracy is concerned, core saturation is recognized to be a major problem. Also, in measurement circuits, extreme care must be taken to minimize the effects of the measurement being conducted on the operation of the circuit itself.

This latter consideration is of particular concern in the measurement of large currents where it is often desireable or necessary to divide the current into proportional fractions by means of proportional resistances and to directly measure the smaller fraction thereof, inferring the total current therefrom. However, as the current becomes larger, it is then necessary to divide the current into more disparate fractions which, in turn, tends to increase the effect of the measurement on the quantity measured, thereby decreasing the accuracy of the measurement. For example, in an arrangement such as that disclosed in U.S. Pat. No. 4,182,982 to Wolf et al, an apertured conductor is provided with a core extending through the aperture and surrounding one leg of the divided current path around the aperture. However, any current induced in the secondary winding wound around the core will cause an E. M. F. opposing the flux in the core and reduce the current flow through that leg of the divided current conductor. This effect will be aggravated as the proportionality of the resistances of the respective legs of the divided conductor is increased. Such an arrangement also makes no provision for controlling flux in the magnetic core and core saturation by the induced magnetic flux may also cause errors in the measurement and, in any event, limits the range of currents over which such a transducer is usable.

The arrangement of Wolf et al also makes no provision for control of resistivity changes in the respective legs of the current divider which may be due to temperature and, therefore, the device is subject to errors induced by changes or gradients in ambient temperature and, often more importantly, by changes due to resistive heating of the current divider arrangement itself or even heating from eddy current losses in the core.

The problem of core saturation is commonly approached by arranging for at least a portion of the induced magnetic flux in the core to be cancelled. This is often done by providing an auxiliary winding on the core and a calibrated current source to cancel predetermined fixed portions of the flux in the core. Such an arrangement is, at best, expensive and requires substantial and difficult design considerations as well as introducing multiple sources of measurement error since the impedance of any current supply circuit must have a finite value and coupling efficiency of such an auxiliary coil will be less than perfect.

Accordingly, in some applications, passive flux cancelling arrangements have been used. For instance, in U.S. Pat. No. 4,626,778 to Friedl, a current is coupled to two separate conductors which are identical in plan view but of differing thickness and, hence, of differing cross-sectional areas and differing resistances. These conductors link the cores with currents arranged in opposing directions to provide flux cancellation for limitation of core saturation. The structure proposed by FriedL is singularly inappropriate for use at high currents or for accurate measurement thereof. Specifically, the arrangement of FriedL requires that connections be made to a plurality of conductors; which connections are subject to aging. Also, while the conductors are placed in close proximity to each other, no provision is made to insure that resistance changes with temperature of the conductors, particularly due to potential resistive heating, have limited effect on the proportionality of the flux in the core to the current traversing the split windings. Further, the resistance of connections to each of the split, one-turn windings is not negligible and, moreover such resistance is subject to change by aging and thermal cycling and is inherently not easily susceptible of accurate calibration.

DISCLOSURE OF THE INVENTION

Accordingly, it is an object of the present invention to provide a differential current shunt particularly adapted to facilitate accurate measurement of large currents.

It is another object of this invention to provide a transformer in which core saturation is avoided over a large range of primary current.

It is a further object of this invention to provide a current dividing differential shunt in which variations in resistive heating are minimized.

It is a yet further object of this invention to provide a current dividing differential shunt in which proportionality of shunt currents is maintained over a wide range of temperatures, primary currents and operating conditions.

It is yet another object of this invention to provide a transformer for accurately producing a voltage which is accurately proportional to a high current over a wide range of primary currents and ambient conditions, including stray magnetic fields.

It is another further object of this invention to provide a current transducer which is resistant to changes in conversion efficiency due to aging and thermal cycling.

The above objects are achieved, according to the invention by the provision of a unitary conductor having two conductive portions of different but substantially equal resistances to divide the current flow into portions which are proportionately substantially equal and link a core in opposite senses, thus reducing the flux in the core to that induced by the small difference between the currents.

Therefore, in accordance with one aspect of the invention, an electrical current shunt is provided comprising a single conductor element having an axis coincident with the direction of intended current flow and having an aperture therein. The aperture defines first and second conductor portions on opposing sides of said aperture in a direction transverse to such axis. The first and second conductor portions differ in resistance from each other to divide the current into nearly equal portions. A core composed of a low reluctance material, a portion of which forms a single, unbranched magnetic circuit is passed through said aperture twice and extends around both said first and second conductor portions to form a single turn winding of each of the first and second conductor portions on the core. A coil is wound on said core for sensing at least a portion of the magnetic flux in the core.

In accordance with a further aspect of the invention, an electrical current shunt is provided having a core of a low reluctance material and having two current carrying members of differing resistances which link said core means in opposite, magnetic flux-cancelling directions with respect to the intended directions of current flow therein. An improvement in the shunt is characterized by a unitary conductor having an aperture, which aperture divides the unitary conductor means into two portions which constitute current carrying members. The current carrying members are thus maintained subject to similar environmental conditions and improved thermal conductivity is established through said conductor.

In accordance with another aspect of the invention, a method of developing a small magnetic flux in a magnetic core means which is accurately proportional to a large current flowing in a unitary conductor having an aperture which thereby forms two conductor portions is provided comprising the steps of establishing the respective resistances of the two conductor portions at differing but substantially equal values, dividing the large current into two differing but substantially equal portions, in proportion to the respective resistance values of the two conductor portions, and linking said currents to the core in opposite, flux-cancelling senses.

Other features and advantages of the present invention will become apparent to those skilled in the art in view of the following detailed disclosure of a preferred embodiment of the invention, particularly with reference to the following drawings.

BEST MODE FOR CARRYING OUT THE INVENTION

Figure 1:
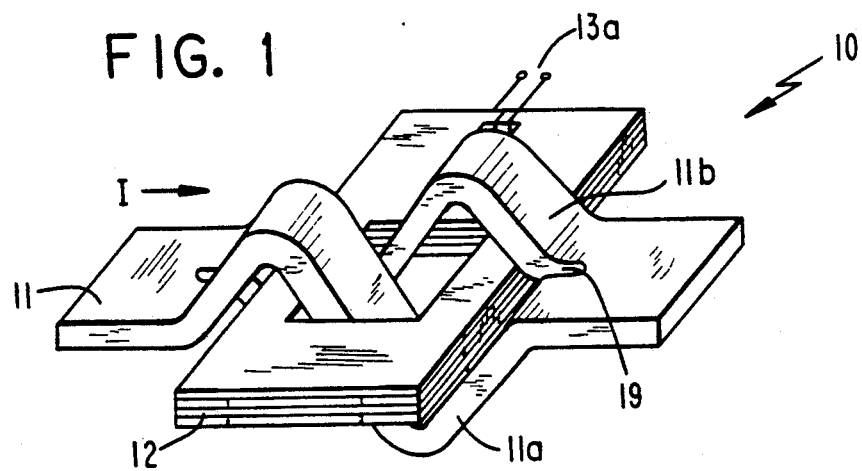
FIG. 1 is an isometric view of a preferred form of the differential current shunt according to the invention.
Figure 2:
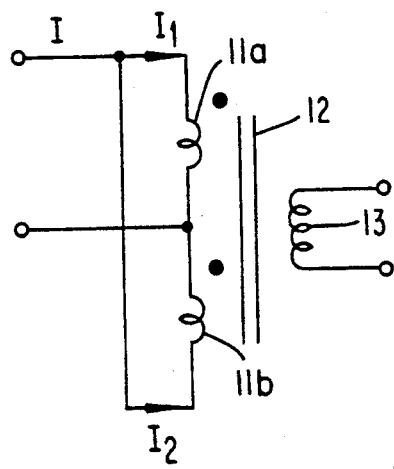
FIG. 2 is an equivalent circuit diagram of the invention of FIG. 1.
Figure 3:
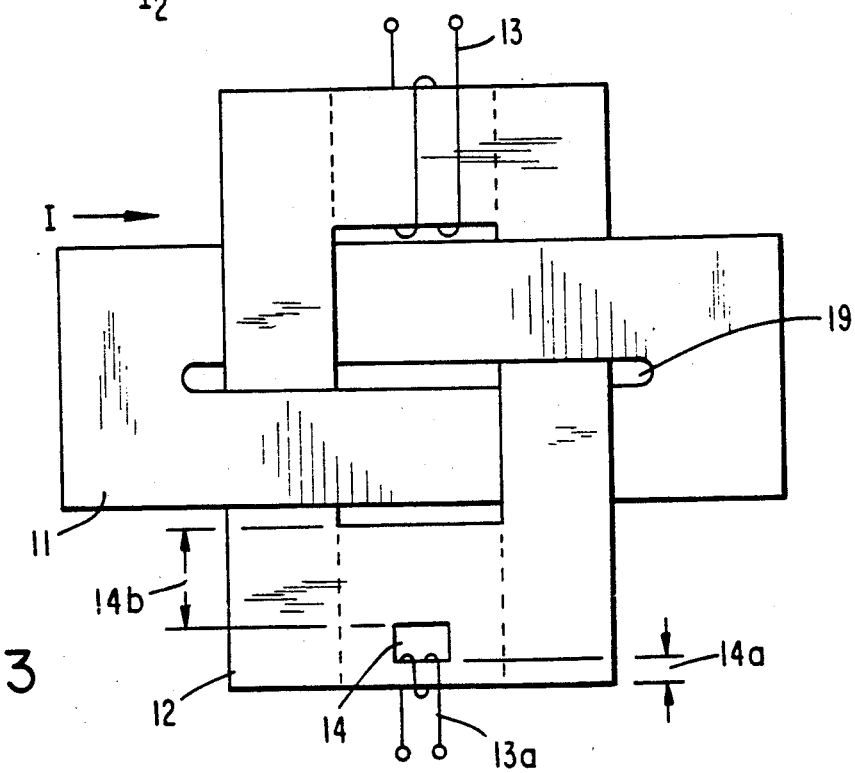
FIG. 3 is a top plan view of the invention corresponding to FIG. 1.
Figure 4:
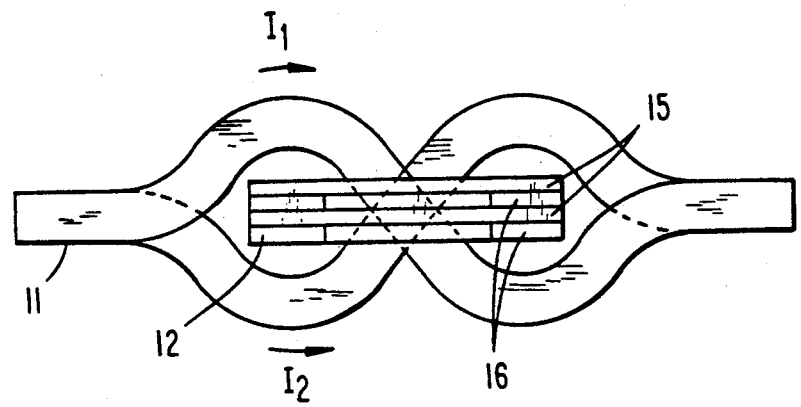
FIG. 4 is a side view of the invention according to FIG. 1.

FIG. 1 is a view of the differential current shunt according to a preferred embodiment of the invention. Top and plan views of this embodiment are also shown in FIGS. 3 and 4, respectively, with like features in each of the views bearing like reference numerals. In this embodiment, a unitary conductor 11 is provided which has an aperture 19 dividing the central portion of the conductor into two conductor portions, 11a and 11b.

As used herein, the term "unitary" will be used to connote that the conductor portions are formed by the formation of an aperture in a single piece conductor rather than by the joining of two initially separate conductor portions, as by soldering. While the conductor may, as desired, be formed of plural lamina (not shown), joined or bonded in any of a number of ways known in the art, it is intended that most, if not all, of such lamina are shaped to form both conductor portions from a single piece of material by the creation of an aperture in such piece or pieces of material.

The aperture should preferably be elongated and located central to the conductor so that the conductor will be divided into two conductor portions which differ only slightly (e.g., on the order of 0.5%) in resistance from each other. This difference can be introduced or brought to a desired value by trimming using any known metal deforming or abrading technique.

The conductor should be of a material which has good electrical conductivity such as copper, silver or aluminum which also have good thermal conductivity as well. If the conductor is constructed of plural lamina, as noted above, the lamina may be of differing materials and may advantageously include one or more lamina of a material such as silver to enhance the thermal conductivity of the conductor. If different metals are used in the plural lamina, it may also be desireable to fabricate some lamina by plating on the surface of other lamina or to provide insulation between the lamina to avoid electrolytic deterioration of the conductor.

The differential current shunt also includes core 12 which is preferably formed of a low reluctance, high permeability material such as iron and may, if desired in view of the anticipated flux densities, be formed of plural lamina of such material or even several such materials. A secondary winding 13 for sensing the induced flux in the core is wound thereon as particularly illustrated in FIG. 3. Alternatively, should the desired voltage or current for output to a measurement instrument being used with the differential shunt of the present invention be potentially larger than desired, an aperture can be formed in the core to provide division of the induced magnetic flux and measurement of a fraction of the flux so divided can be measured by the winding of a secondary coil through such an aperture in the core, as is illustrated at 13a of FIGS. 1 and 3. This feature may also be utilized to extend the range of currents measurable with a given measurement device by providing proportionality between the outputs of two or more such secondary coils 13 and 13a (say, a 10:1 ratio) to provide a plurality of multiplication factors for respective outputs. The winding of the secondary coil through an aperture can also be used to trim the output of the differential shunt without alteration of conductor dimensions (or at least as an alternative thereto) by making slight changes in the dimension 14a with respect to dimension 14b to slightly alter the ratio by which the flux is divided by the aperture 14 in the core. It is to be understood that such an alteration in dimension could also be done in the direction of the thickness of the coil in the same general vicinity of the aperture and in either case can be done by abrading of the core by grinding, sand-blasting, filing, clipping, nibbling, etc.

The ends of conductor 11 are preferably somewhat extended beyond the ends of the aperture in the direction of the axis of the device which is in the same direction as the intended current flow through the differential shunt. This extended distance is not critical to the operation of the device but should be at least a substantial fraction of the length of the aperture. This extended length of the ends of the conductor serves the practical purpose of receiving a connector structure (not shown) to provide an extremely low resistance connection at both ends of the differential shunt and to provide a good path for thermal communication between the two conductor portions.

In addition to the thermal communication provided through the ends of the conductor, the interstices between the conductor portions within the conductor aperture 19 and around the core can be filled with a material of high thermal conductivity such as a silicon compound similar to heat sink compound or coolant oil or even mere lacquer insulation to provide optimum thermal communication between the conductor portions 11a and 11b. It is also to be understood that while electrical insulation is necessary between the conductor portions, the invention inherently tends to have the property of voltage grading since adjacent portions of the conductor structure will be at similar potentials and electrical insulation requirements are thereby minimized. Also, while the preferred embodiment is illustrated in a manner which slightly exaggerates the open volume within the conductor aperture 19 for clarity, it is to be understood that the empty volume can be made very small and that substantial thermal coupling can be achieved through the material of the core which is within or proximate to the aperture. Effectively, the only limitation on how small the volume can be made is that sufficient spacing must be maintained between portions of the core such that any flux leakage there across must be kept at a very low level, for instance, two orders of magnitude below the flux in the core. Since the invention maintains the flux in the core at a low level and well below saturation, this constraint can easily be met.

By the above geometrical and construction feature of the present invention, a differential shunt with much improved stability and accuracy over a wide range of operational and environmental conditions is provided since any resistance in the connections made to the differential shunt will be common to both conductor portions and, further, since improved thermal conductivity is provided at the ends of the conductor, the two conductor portions can be maintained at a more exactly equal temperature and the ratio of resistances thereof is held constant with an enhanced accuracy which is not subject to aging through thermal cycling, oxidation, corrosion, etc. It should also be understood that the core itself can form a significant component of the thermal communication between the two conductor portions, especially where coating or encapsulation, as described above improves thermal communication between the conductor portions and the core.

Figure 5:
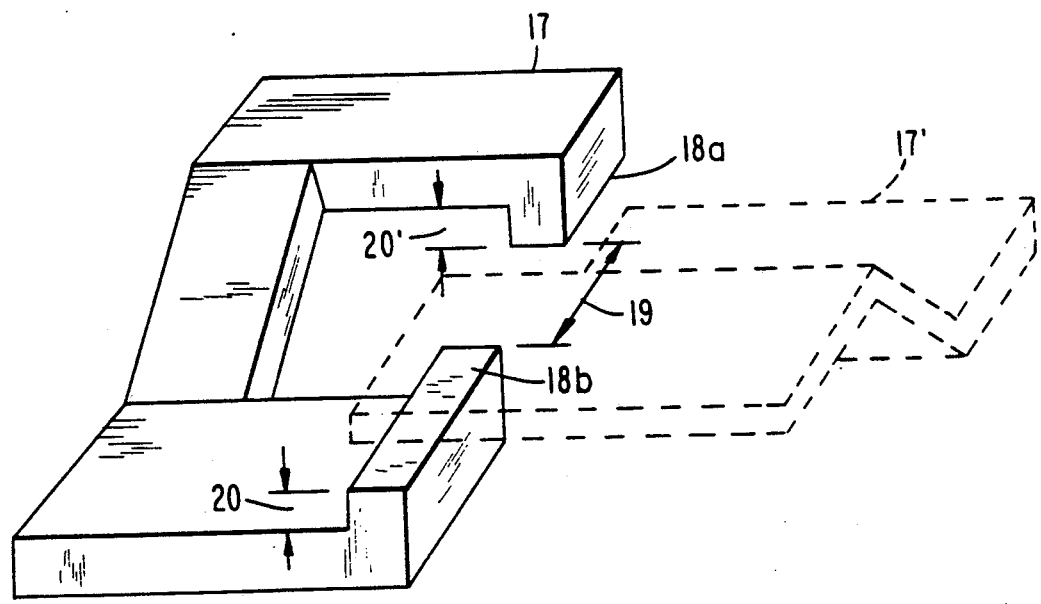
FIG. 5 is an isometric view of an alternative form of a portion of the core also corresponding to the view shown in FIG. 2.

FIG. 5 shows an alternative form of the core structure which is particularly adapted to the provision of a flat, compact assembly. It should be understood in this regard that any degree of curvature in each of the conductor and core portions is possible and may be preferable in some applications. In the embodiment of FIG. 1, for example, the core is fabricated in a substantially planar configuration which is inserted through the curved conductor portions. The configuration of FIG. 5 permits the conductor to have a planar configuration. It will be readily understood that any configuration between the two extremes is possible using appropriate features of either arrangement.

The core of the embodiment of FIG. 5 is preferably configured in two identical portions 17, 17' (shown in dashed outline) for purposes of manufacturing economy. These identical portions can also be fabricated in plural, thin, mutually insulated layers or lamina as is known in the art to reduce eddy currents and the losses associated therewith. Dimension 19 of the core portions is preferably equal to the thickness of the conductor portions to permit assembly to form the configuration shown in plan view in FIG. 3. The vertical dimensions 20, 20' of the legs 18b and 18a, respectively may be made complementary to facilitate assembly by bolting, spot welding, etc. or may be formed by spacers of a material similar to that of the core which also may be laminated structures as may be found desirable. Also, as will be discussed more fully below, it may be useful to form these legs or spacers 18a, 18b in a fashion to provide a gap in the core. In this case, a single core element which corresponds to a pair 17, 17' of the core portions shown in FIG. 5 can be formed, threaded through the conductor portions and finally assembled by pressing the core into final shape corresponding to a pair of the portions such as is illustrated in FIG. 5.

In the embodiment shown in FIG. 5 or the variants thereon discussed above, the secondary winding can be preformed and placed over one of the core portions or a portion of a singular piece corresponding to a pair of such portions prior to final assembly by bolting, welding or pressing or can be wound on the core or through an aperture therein either before or after final assembly as noted above.

The unitary conductor of the present invention has been shown above to have significant advantages over the prior art. The practical necessity of a split core in order to fabricate the present invention in a manner consistent with such a unitary conductor also engenders unexpected advantages over the prior art. As also pointed out above, the slight resistive imbalance between the two conductor portions which provides the inexact, but nevertheless predictable and highly stable, near-cancellation of magnetic fluxes in the core can engender eddy currents around the core, particularly if the DC component is high and in certain geometrical configurations. Also, as is well understood, a continuous, low reluctance core can be readily saturated by a small current or current imbalance in a winding or windings linking such a core since a high magnetic flux can be generated by a small current in such a low reluctance path. The necessary gap in the core for assembly of the core to the unitary conductor according to the invention prevents such currents around the core and increases the magnetic reluctance of the core, thus preventing alteration of the flux and possible saturation or approaches thereto which might affect the accuracy of the transformer action of the present invention, thus entirely removing a potential source of substantial errors in the transformer action of the devices of the prior art. These errors, particularly as they may involve DC components of flux are a particularly troublesome source of error since no indication of their existence will appear on the secondary winding, however formed, to indicate to an operator the possible existence of such a possible source of error. The necessary gap in the core to accommodate the unitary conductor increases the reluctance and interrupts the current path in the core of the differential current shunt according to the invention and the differential current shunt will therefore perform well whether or not a substantial DC component is present in the input current.

By the foregoing, a current transforming device and method has been provided which, by virtue of a unitary conductor member having separate conductor portions having differing but nearly equal resistivities, exhibits excellent long-term stability and resistance to aging as well as exceptional operational stability due to the enhanced thermal communication between the conductor portions. The current transforming device is also compact, low cost, of high accuracy over a wide dynamic range and insensitive to DC current components.

While several possible embodiments and variations on the basic inventive arrangements have been disclosed, other variations embodying the essential inventive concepts of the present invention will be apparent to those skilled in the art in view of the above detailed disclosure. For instance, other conductor configurations corresponding in shape to and complementary with the core portion configuration of FIG. 5, formed by welding or even casting can be advantageously employed without departing from the spirit and scope of the present invention. Accordingly, it is to be understood that the foregoing detailed description is given by way of example and not of limitation; The scope of the present invention being limited only by the appended claims.

We claim:

1. An electrical current shunt comprising a single conductor element having an axis coincident with the direction of intended current flow therein and having an aperture therein, said aperture defining first and second conductor portions on opposing sides of said aperture positioned with respect to said aperture in a direction transverse to said axis, said first and second conductor portions differing in resistance from each other,
   core means composed of a low reluctance material, a portion thereof forming a single, unbranched magnetic circuit passing through said aperture twice and extending around both said first and second conductor portions, and
   coil means wound on said core means for sensing at least a portion of the magnetic flux in said core means.

2. An electrical current shunt as recited in claim 1, wherein said aperture in said conductor means is elongated in the direction of said axis.

3. An electrical current shunt as recited in claim 2, wherein said conductor portions each have portions which are displaced from a plane parallel to said axis and said direction transverse to said axis, forming at least oppositely oriented ogee sections.

4. An electrical current shunt as recited in claim 3, wherein said core means is formed with two generally parallel portions which pass through said aperture in said conductor means proximate to said oppositely oriented ogee sections of said conductor portions.

5. An electrical current shunt as recited in claim 1, wherein said core means includes an aperture therein for causing division of magnetic flux therein and wherein said coil means is wound through said aperture.

6. In an electrical current shunt having a core means of a low reluctance material and having two current carrying members of differing resistances which link said core means in opposite, magnetic flux-cancelling directions with respect to the intended directions of current flow therein, the improvement comprising:
   a unitary conductor means having an aperture, said aperture dividing said unitary conductor means into two portions which constitute said current carrying members,
   whereby said current carrying members are maintained subject to similar environmental conditions and thermal conductivity is established through said conductor means.

7. In an electrical current shunt according to claim 6, the improvement further comprising a coil means for sensing the magnetic flux in said core means.

8. In an electrical current shunt as recited in claim 6, the improvement further comprising said aperture in said conductor means being elongated in the direction of said axis.

9. In an electrical current shunt as recited in claim 8, the improvement further comprising said conductor portions each having portions which are displaced from a plane parallel to said axis and said direction transverse to said axis, forming at least oppositely oriented ogee sections.

10. In an electrical current shunt as recited in claim 9, the improvement further comprising said core means being formed with two generally parallel portions which pass through said aperture in said conductor means proximate to said oppositely oriented ogee sections of said conductor portions.

11. In an electrical current shunt as recited in claim 7, the improvement further comprising said conductor portions each having portions which are displaced from a plane parallel to said axis and said direction transverse to said axis, forming at least oppositely oriented ogee sections.

12. In an electrical current shunt as recited in claim 11, the improvement further comprising said core means being formed with two generally parallel portions which pass through said aperture in said conductor means proximate to said oppositely oriented ogee sections of said conductor portions.

13. In an electrical current shunt as recited in claim 12, the improvement further comprising said core means including an aperture therein for causing division of magnetic flux therein and wherein said coil means is wound through said aperture.

14. A method of developing a small magnetic flux in a magnetic core means which is accurately proportional to a large current flowing in a unitary conductor having an aperture therein forming two conductor portions comprising the steps of
   establishing the respective resistances of said two conductor portions at differing but substantially equal values,
   dividing the said large current into two differing but substantially equal portions, in proportion to said respective resistance values, flowing on either side of said aperture, and
   linking said currents to said core in opposite, flux-cancelling senses.

15. The method recited in claim 14 including the further step of sensing at least a portion of said flux in said core means.

* * * * *